(12) United States Patent
Snowdon

(10) Patent No.: US 8,779,839 B2
(45) Date of Patent: Jul. 15, 2014

(54) CONSTANT $V_{gs}$ SWITCH

(75) Inventor: Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 205 days.

(21) Appl. No.: 13/331,332

(22) Filed: Dec. 20, 2011

(65) Prior Publication Data
US 2013/0154720 A1    Jun. 20, 2013

(51) Int. Cl.
*H03K 17/687*    (2006.01)

(52) U.S. Cl.
USPC .......................................... 327/427; 327/419

(58) Field of Classification Search
USPC ................. 327/384–386, 389, 419, 427–437, 327/534–537
See application file for complete search history.

(56) References Cited

U.S. PATENT DOCUMENTS

| | | | |
|---|---|---|---|
| 4,093,874 A | 6/1978 | Pollitt | |
| 7,002,405 B2 | 2/2006 | Brooks et al. | |
| 7,427,887 B2 | 9/2008 | O'donnell et al. | |
| 7,436,241 B2 | 10/2008 | Chen et al. | |
| 7,782,117 B2 | 8/2010 | Stultz et al. | |
| 8,009,395 B2 | 8/2011 | Graves et al. | |
| 8,547,159 B2 | 10/2013 | Morra | |
| 8,610,489 B2 | 12/2013 | Daigle et al. | |
| 2003/0016072 A1* | 1/2003 | Ramakrishnan | 327/434 |
| 2004/0196089 A1 | 10/2004 | O'donnell et al. | |
| 2010/0225379 A1 | 9/2010 | Ramet | |
| 2011/0260780 A1 | 10/2011 | Granger-jones et al. | |
| 2012/0286845 A1 | 11/2012 | Morra | |
| 2013/0307591 A1 | 11/2013 | Daigle et al. | |

FOREIGN PATENT DOCUMENTS

| | | |
|---|---|---|
| CN | 1866742 A | 11/2006 |
| CN | 1320298 A | 10/2011 |
| CN | 102790608 A | 11/2012 |
| CN | 202652168 U | 1/2013 |
| CN | 103427815 A | 12/2013 |

OTHER PUBLICATIONS

"U.S. Appl. No. 13/107,491, Final Office Action mailed Feb. 7, 2013", 14 pgs.
"U.S. Appl. No. 13/107,491, Non Final Office Action mailed Sep. 7, 2012", 12 pgs.
"U.S. Appl. No. 13/107,491, Notice of Allowance mailed May 28, 2013", 6 pgs.
"U.S. Appl. No. 13/107,491, Preliminary Amendment mailed May 13, 2011", 6 pgs.
"U.S. Appl. No. 13/107,491, Response filed Jan. 7, 2013 to Non Final Office Action mailed Sep. 7, 2012", 10 pgs.

(Continued)

*Primary Examiner* — Lincoln Donovan
*Assistant Examiner* — Diana J Cheng
(74) *Attorney, Agent, or Firm* — Schwegman, Lundberg & Woessner, P.A.

(57) ABSTRACT

This document discusses, among other things, a signal switch circuit including a first field effect transistor (FET) configured to couple a first node to a second node in an on-state and a charge pump circuit configured to provide a first supply voltage to control the FET, wherein a reference voltage of the charge pump circuit is coupled to a well of the FET to maintain a constant gate to source voltage of the FET during the on-state.

20 Claims, 1 Drawing Sheet

(56) References Cited

OTHER PUBLICATIONS

"U.S. Appl. No. 13/107,491, Response filed May 6, 2013 to Final Office Action mailed Feb. 7, 2013", 7 pgs.
"U.S. Appl. No. 13/471,832, Notice of Allowance mailed Jul. 9, 2013", 9 pgs.
"Chinese Application Serial No. 201220710553.2, Notification to Make Rectification mailed Apr. 10, 2013", 2 pgs.
"Chinese Application Serial No. 201220710553.2, Response filed Apr. 15, 2013 to Notification to Make Rectification mailed Apr. 10, 2013", 5 pgs.
"U.S. Appl. No. 13/471,832, Notice of Allowance mailed Aug. 14, 2013", 8 pgs.
"Chinese Application U.S. Appl. No. 201320265913.7, Notification to Make Rectification mailed Aug. 15, 2013", 2 pgs.
Chinese Application Serial No. 201210147424.1, Office Action mailed Apr. 2, 2014, w/English Translation, 11 pgs.

\* cited by examiner

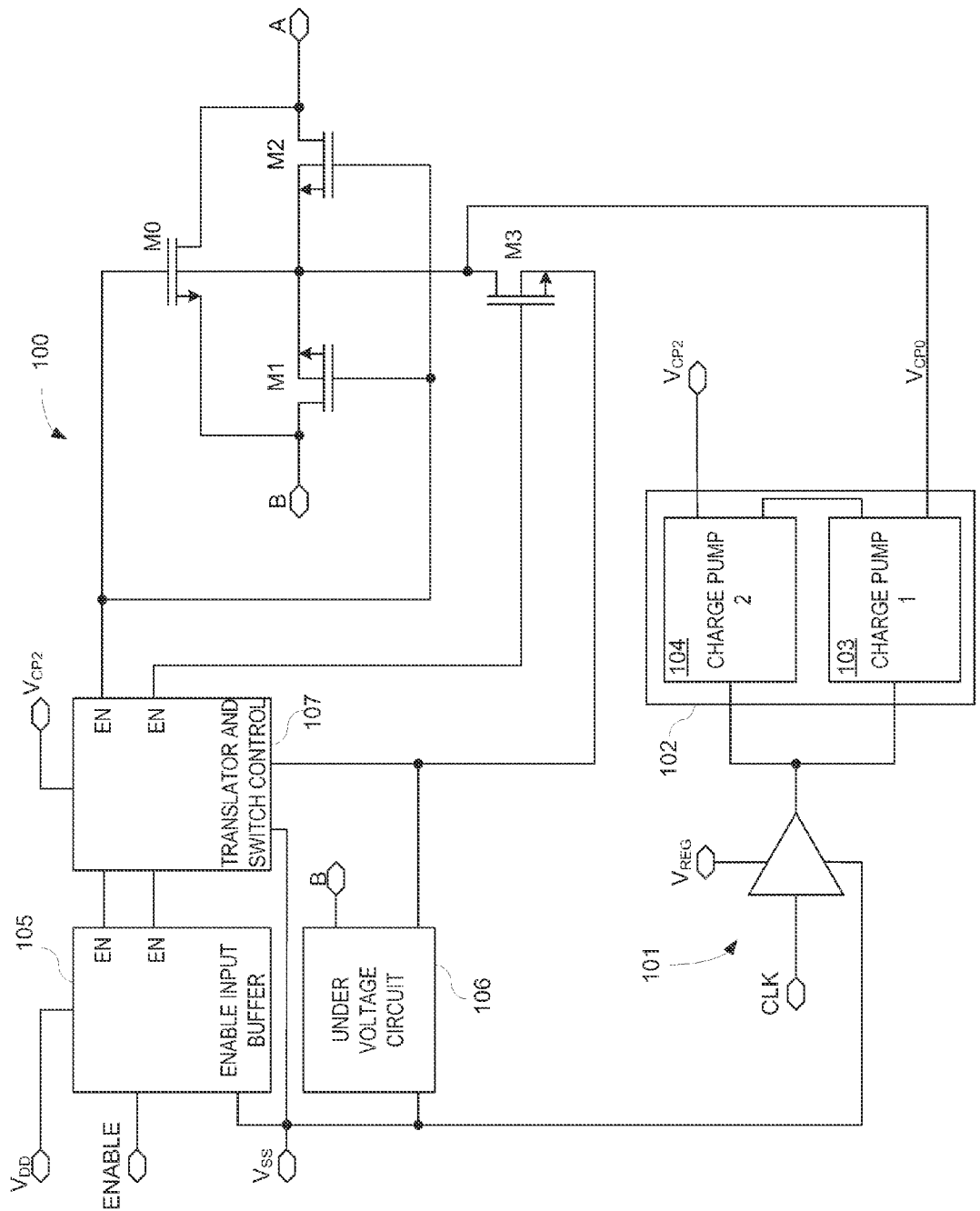

CONSTANT $V_{gs}$ SWITCH

CROSS-REFERENCE TO RELATED PATENT DOCUMENTS

This patent application is related to Stultz et al. U.S. patent application Ser. No. 12/337,709, now U.S. Pat. No. 7,782,117, entitled "CONSTANT SWITCH VGS CIRCUIT FOR MINIMIZING RFLATNESS AND IMPROVING AUDIO PERFORMANCE," filed on Dec. 18, 2008, and Maher, U.S. patent application Ser. No. 13/107,491, entitled, "CONSTANT VGS ANALOG SWITCH," filed on May 13, 2011.

BACKGROUND

Metal oxide semiconductor field-effect transistor (MOSFET) devices can be used as switches for coupling electronic signals. Generally, MOSFET switches demonstrate little to no offset voltage that can be found in bipolar or other solid state switches. Typically, MOSFET switch on-resistance ($R_{on}$) is very low and off resistance ($R_{off}$) is very high. In modern devices, $R_{on}$ can be on the order of an ohm and $R_{off}$ can be many megohms. In MOSFET switches, $R_{on}$ can be a function of the gate to source voltage, $V_{gs}$, of the device. Since $R_{on}$ is a function of $V_{gs}$, $R_{on}$ can be reasonably constant if $V_{gs}$ is constant, other conditions being equal. When such switch devices are used for audio signals, the fidelity of the transferred signal across the switch can be negatively affected if $R_{on}$ changes with the input signal voltage level. One measure of the audio fidelity of a switch is the total harmonic distortion (THD) introduced by the switch. The changing $R_{on}$ can increase the THD.

Keeping MOSFET $R_{on}$ constant despite input signal voltage variations is an object of Pollitt U.S. Pat. No. 4,093,874, entitled, "Constant Impedance MOSFET Switch" (herein, "the '874 patent"). The '874 patent keeps $V_{gs}$, constant (at a set temperature) regardless of changes in the input signal voltage. The '874 patent, however, uses the logic signal voltage value, which turns the switch on/off, to determine the $V_{gs}$ level. However, the logic signal voltage value can change as the power supply voltage, which produces the logic signal voltage, changes with a load. Such changes in $V_{gs}$, can change $R_{ON}$ and, thus, limit the useful dynamic range of the '874 patent.

OVERVIEW

This document discusses, among other things, a signal switch circuit including a first field effect transistor (FET) configured to couple a first node to a second node in an on-state and a charge pump circuit configured to provide a first supply voltage to control the FET, wherein a reference voltage of the charge pump circuit is coupled to a well of the FET to maintain a constant gate to source voltage of the FET during the on-state.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates generally an example switch circuit.

DETAILED DESCRIPTION

Conducting a signal between two circuit nodes is one of the many transistor switch applications. The present inventor has recognized, among other things, methods and apparatus to conduct a signal between two nodes using a transistor such that distortion of the signal due to transistor gate-to-source voltage $V_{gs}$, variations is minimized. In addition, the methods and apparatus discussed below can reduce the amount of power used to operate the switch compared with existing switching methods and apparatus.

FIG. 1 illustrates general an example switch circuit 100 configured to conduct a signal between node A and node B in a first state, such as an on-state, and to isolate node A from node B in a second state, such as an off-state. In certain examples, the signal can be applied to or received at either node A or node B. In certain examples, the switch circuit 100 can include a regulated buffer 101 to drive an input to a power supply 102, such as a latched charge pump, a switching amplifier, a pelleconi charge pump, etc.

In an example, the power supply 102 can provide supply voltage $V_{CP2}$ to control a gate of a pass transistor M0. During an on-state of the pass transistor M0, the on-resistance of the pass transistor M0 between node A and node B can be relatively low. During an off-state of the pass transistor M0, the off-resistance of the pass transistor M0 between node A and node B can be relatively high. In an example, the pass transistor M0 can include a field effect transistor (FET), such as a complementary metal oxide semiconductor (CMOS) FET.

In addition to the pass transistor M0, the switch circuit 100 can include first and second transistors M1, M2 configured to couple node A and node B with a well of the pass transistor M0. In certain examples, the first and second transistors M1, M2 can include a field effect transistor (FET), such as a complementary metal oxide semiconductor (CMOS) FET.

In an example, a reference voltage $V_{CP0}$ of the power supply 102 can be coupled to the well of the pass transistor M0. In such a configuration, as the signal common mode varies above and below ground at nodes A and B, a voltage across the gate and source $V_{gs}$, of the pass transistor M0 can remain substantially constant. The substantially constant $V_{GS}$ of the pass transistor M0, when the pass transistor is enabled, can reduce the variation of the on-resistance $R_{ON}$ of the pass transistor M0. A substantially constant $R_{ON}$, even when the signal is varying above and below ground, can allow the pass transistor M0 to conduct the signal between nodes A and B with little or no distortion. In certain examples, after the initial charge of the supply voltage $V_{CP2}$ and bypass capacitors, the switch circuit 100 can consume little if any static power.

In certain examples, the regulated buffer 101 can receive a regulated supply voltage $V_{REG}$ that is substantially constant over variations of process, voltage, and temperature (PVT). In certain examples, the power supply 102 can include first and second charge pumps 103, 104 coupled in series. The charge pumps can provide a supply voltage $V_{CP2}$ that is about twice the input signal swing. In such an example, the charge pumps 103, 104 and the regulated buffer 101 can transform a clock input CLK into the supply voltage $V_{CP2}$. In an example, the most negative voltage of the power supply 102, such as the reference voltage $V_{CP0}$ of the first charge pump 103, can be coupled to the well of the pass transistor M0 and the first and second transistors M1, M2. When the pass transistor M0 is enabled, the well of the pass transistor M0 can track the signal such that the pass transistor gate-to-source voltage $V_{gs}$ can remain substantially constant. In an example, the most negative voltage of the power supply 102, such as the reference voltage $V_{CP0}$ can be coupled directly to the well of the pass transistor M0. In an example, the most negative voltage of the power supply 102, such as the reference voltage $V_{CP0}$ can be coupled to the well of the pass transistor M0 using a frequency dependent impedance (e.g., a low pass filter) to allow the reference voltage $V_{CP0}$ to follow the common mode of the signal. In an example, the regulated buffer 101 can include a regulated voltage supply.

In certain examples, the $R_{ON}$ of the pass transistor M0 can vary about 30 milliohms or less when passing a 1 kHz, 4.5 volt peak-to-peak audio signal. In certain examples, the pass transistor can couple to and switch the transmission of a variety of signals and signal sources including, but not limited to, universal serial bus (USB) data lines, mobile high-definition link (MHL) data lines, analog signals including analog audio signals and analog video signals, etc.

In certain examples, an integrated circuit can include the pass transistor M0, the first and second transistors M1, M2, and the power supply 102. In an example, an integrated circuit can include the pass transistor M0, the first and second transistors M1, M2, the power supply 102, and the regulated buffer 101.

In certain examples, the switch circuit 100 can include an enable input buffer 105 configured to buffer a received enable signal (ENABLE), an under voltage circuit 106, and a translator and switch control circuit 107 configured to translate the enable input signal and provide a buffered and translated enable input signal to the pass transistor M0. In an example, the switch circuit 100 can include a third transistor M3 configured to couple the well of the pass transistor M0 to an output of the under voltage circuit 106 when the pass transistor M0 is disabled. In an example, the third transistor M3 can include a field effect transistor (FET), such as a complementary metal oxide semiconductor (CMOS) FET.

In certain examples, the output of the under voltage circuit 106 can provide the most negative voltage level received at the under voltage circuit 106. Coupling the well of the pass transistor M0 to the output of the under voltage circuit 106 can ensure that the pass transistor M0 remains in a high impedance state when not enabled. The example of FIG. 1 illustrates the under voltage circuit 106 receiving a system supply voltage $V_{SS}$ and the signal present at node B and providing an output representing the lower voltage level of the system supply voltage $V_{SS}$ or the signal present at node B. In an example, the under voltage circuit 106 can receive the signal present at node A instead of the signal present at node B. In an example, the under voltage circuit 106 can receive a system supply voltage $V_{SS}$, the signal present at node B, and the signal present at node A, and can provide at an output a representation of the lowest voltage level of the system supply voltage $V_{SS}$, the signal present at node B, or the signal present at node A.

In an example, an integrated circuit can include the pass transistor M0, the first and second transistors M1, M2, the third transistor M3, the power supply 102, and the regulated buffer 101. In an example, an integrated circuit can include the pass transistor M0, the first and second transistors M1, M2, the power supply 102, the regulated buffer 101, the enable buffer 105, the under voltage circuit 106, and the translator and switch control circuit 107.

Additional Notes & Examples

In Example 1, a switch circuit, such as a switch circuit defining an on-state and an off-state, the switch circuit, when in an on-state, couples a first node to a second node and, when in the off-state, isolates the first node from the second node, can include a first field effect transistor (FET) configured to couple the first node to the second node in the on-state, a power supply configured to provide a first supply voltage to control the FET, and wherein a reference voltage of the power supply is coupled to a well of the FET to maintain a constant gate to source voltage of the FET during the on-state.

In Example 2, the switch circuit of claim 1 optionally includes a second FET coupled to the first node, a third FET coupled to the second node, and wherein the second and third FETs are configured to couple the reference voltage of the power supply to the first and second nodes during the on-state.

In Example 3, the switch circuit of any one or more of claims 1-2, wherein an integrated circuit optionally includes the first second and third FETs and the power supply.

In Example 4, the power supply of any one or more of Examples 1-3 optionally includes first and second charge pumps.

In Example 5, the first and second charge pumps of any one or more of Examples 1-4 optionally are configured to receive a regulated supply voltage.

In Example 6, the switch circuit of any one or more of Examples 1-4 optionally includes a clock buffer configured to receive a first charge pump clock signal and to provide a second charge pump clock signal using the regulated supply voltage.

In Example 7, the difference between the first supply voltage and the reference voltage of the charge pump of any one or more of Examples 1-6 is optionally configured to be greater than a voltage swing of a signal applied to the first node.

In Example 8, the switch circuit of any one or more of claims 1-7, optionally includes a translation circuit configured to reference a control signal of the FET to the lower of a second supply voltage or a signal applied to the first node.

In Example 9, the switch circuit of any one or more of claims 1-7, optionally includes an under voltage circuit configured to provide the signal applied to the first node to the translation circuit when a voltage of the signal applied to the first node is below the second supply voltage.

In Example 10, the switch circuit of any one or more of claims 1-9, optionally includes a fourth FET configured to couple the reference voltage of the power supply to the signal applied to the first node when the signal applied to the first node is at a voltage level lower than the second supply voltage.

In Example 11, the switch circuit of any one or more of claims 1-10, optionally includes a switch control buffer configured to receive the control signal from the translation circuit, to provide a first control signal to the FET, and to provide a second control signal to the fourth FET.

In Example 12, the first FET of any one or more of claims 1-11, optionally is optionally configured to couple to at least one of a universal serial bus (USB) data line, a mobile high-definition link (MHL) data line, or an audio signal.

In Example 13, a method for operating a switch circuit that includes an on-state and an off-state, the switch circuit, when in an on-state, couples a first node to a second node and, when in the off-state, isolates the first node from the second node can include providing a first supply voltage using a charge pump, controlling a field effect transistor (FET) using the first supply voltage, the FET coupled between the first node and the second node, and referencing a well of the FET to a reference voltage of the charge pump to maintain a constant gate to source voltage of the FET during the on-state.

In Example 14, the method of any one or more of claims 1-13 optionally includes coupling the reference voltage of the charge pump to the first node during the on-state using a second FET.

In example 15, the method of any one or more of claims 1-14 optionally includes coupling the reference voltage of the charge pump to the second node during the on-state using a third FET.

In Example 16, the providing a first supply voltage of any one or more of claims 1-15 optionally includes receiving a regulated supply voltage at the charge pump.

In Example 17, the method of any one or more of claims 1-16 optionally includes referencing a control signal of the FET to the lower of a second supply voltage or a voltage of a signal applied to the first node using a translation circuit.

In Example 18, the referencing a control signal of any one or more of claims 1-17 optionally includes receiving the signal applied to the first node at the translation circuit when a voltage of the signal applied to the first node is below the second supply voltage.

In Example 19, the method of any one or more of claims 1-18 optionally includes coupling the signal applied to the first node with the reference voltage using a fourth FET when the signal applied to the first node is at a voltage level lower than the second supply voltage.

In Example 20, the method of any one or more of claims 1-19 optionally includes providing the control signal of the FET from a switch control buffer, and providing a control signal of the fourth FET from the switch control buffer.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A switch circuit defining an on-state and an off-state, the switch circuit, when in an on-state, couples a first node to a second node and, when in the off-state, isolates the first node from the second node, the switch circuit comprising:
    a first field effect transistor (FET) configured to couple the first node to the second node in the on-state;
    a charge pump configured to provide a first supply voltage to control the FET; and
    wherein a reference voltage of the charge pump is coupled to a well of the FET to maintain a constant gate to source voltage of the FET during the on-state.

2. The switch circuit of claim 1, including:
    a second FET coupled to the first node;
    a third FET coupled to the second node; and
    wherein the second and third FETs are configured to couple the reference voltage of the power supply to the first and second nodes during the on-state.

3. The switch circuit of claim 2, wherein an integrated circuit includes the first, second, and third FETs and the power supply.

4. The switch circuit of claim 2, wherein the charge pump includes first and second charge pumps coupled in series.

5. The switch circuit of claim 4, wherein the first and second charge pumps are configured to receive a regulated supply voltage.

6. The switch circuit of claim 5, including a clock buffer configured to receive a first charge pump clock signal and to provide a second charge pump clock signal using the regulated supply voltage.

7. The switch circuit of claim 4, wherein the difference between the first supply voltage and the reference voltage of the charge pump is configured to be greater than a voltage swing of a signal applied to the first node.

8. The switch circuit of claim 1, including a translation circuit configured to reference a control signal of the FET to the lower of a second supply voltage or a signal applied to the first node.

9. The switch circuit of claim 8, including an under voltage circuit configured to provide the signal applied to the first node to the translation circuit when a voltage of the signal applied to the first node is below the second supply voltage.

10. The switch circuit of claim 9, including a fourth FET configured to couple the reference voltage of the power supply to the signal applied to the first node when the signal applied to the first node is at a voltage level lower than the second supply voltage.

11. The switch circuit of claim 9, including a switch control buffer configured to receive the control signal from the translation circuit, to provide a first control signal to the FET, and to provide a second control signal to the fourth FET.

12. The switch circuit of claim 1, wherein the first FET is configured to couple to at least one of a universal serial bus (USB) data line, a mobile high-definition link (MHL) data line, or an audio signal.

13. A method for operating a switch circuit that includes an on-state and an off-state, the switch circuit, when in an on-state, couples a first node to a second node and, when in the off-state, isolates the first node from the second node, the method comprising:

providing a first supply voltage using a charge pump;
controlling a field effect transistor (FET) using the first supply voltage, the FET coupled between the first node and the second node; and
referencing a well of the FET to a reference voltage of the charge pump to maintain a constant gate to source voltage of the FET during the on-state.

14. The method of claim 13, including coupling the reference voltage of the charge pump to the first node during the on-state using a second FET.

15. The method of claim 14, including coupling the reference voltage of the charge pump to the second node during the on-state using a third FET.

16. The method of claim 13, wherein the providing a first supply voltage includes receiving a regulated supply voltage at the charge pump.

17. The method of claim 13, including referencing a control signal of the FET to the lower of a second supply voltage or a voltage of a signal applied to the first node using a translation circuit.

18. The method of claim 17, wherein the referencing a control signal includes receiving the signal applied to the first node at the translation circuit when a voltage of the signal applied to the first node is below the second supply voltage.

19. The method of claim 17, including coupling the signal applied to the first node with the reference voltage using a fourth FET when the signal applied to the first node is at a voltage level lower than the second supply voltage.

20. The method of claim 19 including:
providing the control signal of the FET from a switch control buffer; and
providing a control signal of the fourth FET from the switch control buffer.

\* \* \* \* \*